United States Patent [19]

Fraleux et al.

[11] 4,382,187
[45] May 3, 1983

[54] ELECTROMAGNETIC RADIATION DETECTION MATRIX

[75] Inventors: Jean Fraleux; Jean L. Ploix, both of Paris, France

[73] Assignee: Thomson-CSF, Paris, France

[21] Appl. No.: 204,178

[22] Filed: Nov. 5, 1980

[30] Foreign Application Priority Data

Nov. 9, 1979 [FR] France .................. 79 27708

[51] Int. Cl.³ .................. H01J 40/14; H04N 5/30
[52] U.S. Cl. .................. 250/578; 250/211 J; 357/32; 358/213
[58] Field of Search .................. 250/211 J, 578; 357/31, 357/32; 358/212, 213

[56] References Cited

U.S. PATENT DOCUMENTS

| | | | |
|---|---|---|---|
| 3,683,193 | 8/1972 | Weimer | 357/32 X |
| 3,715,485 | 2/1973 | Weimer | 250/578 X |
| 4,155,006 | 5/1979 | Sato et al. | 250/211 J |
| 4,291,337 | 9/1981 | Takamura et al. | 250/211 J X |

Primary Examiner—David C. Nelms
Assistant Examiner—Edward P. Westin
Attorney, Agent, or Firm—Roland Plottel

[57] ABSTRACT

A matrix having photosensitive elements formed by thin-film technology on the same dielectric substrate and disposed at each crossing point of perpendicular lines and columns. An addressing MOS transistor, formed by thin-film technology and associated with each photosensitive element, receives periodically on its grid an enabling signal applied simultaneously to all the addressing transistors in the same line of photosensitive elements and is connected for transferring to a video amplifier the electric signals provided by each addressed line of photosensitive elements. An amplifier for these signals is associated with each photosensitive element and is formed by thin-film technology.

16 Claims, 4 Drawing Figures

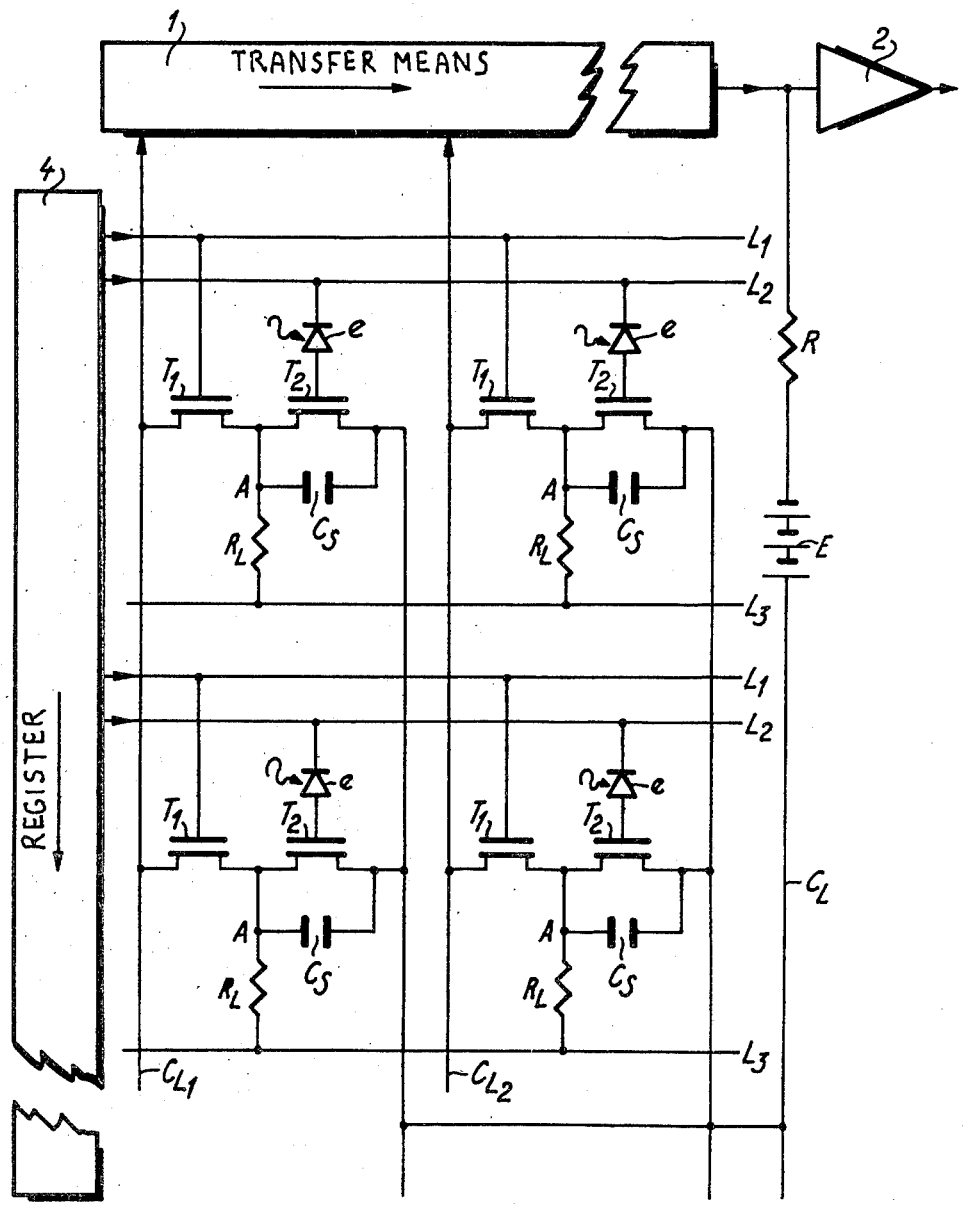

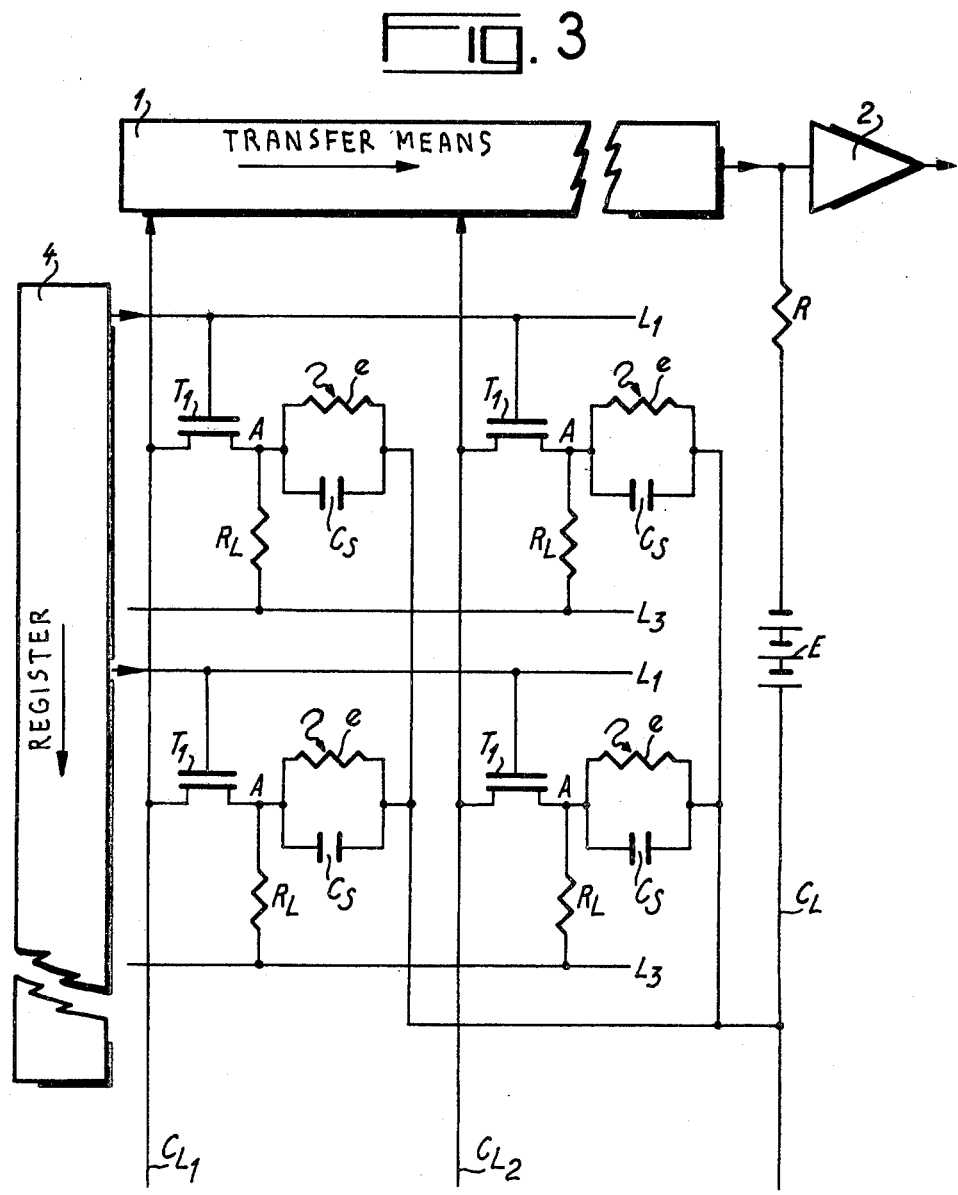

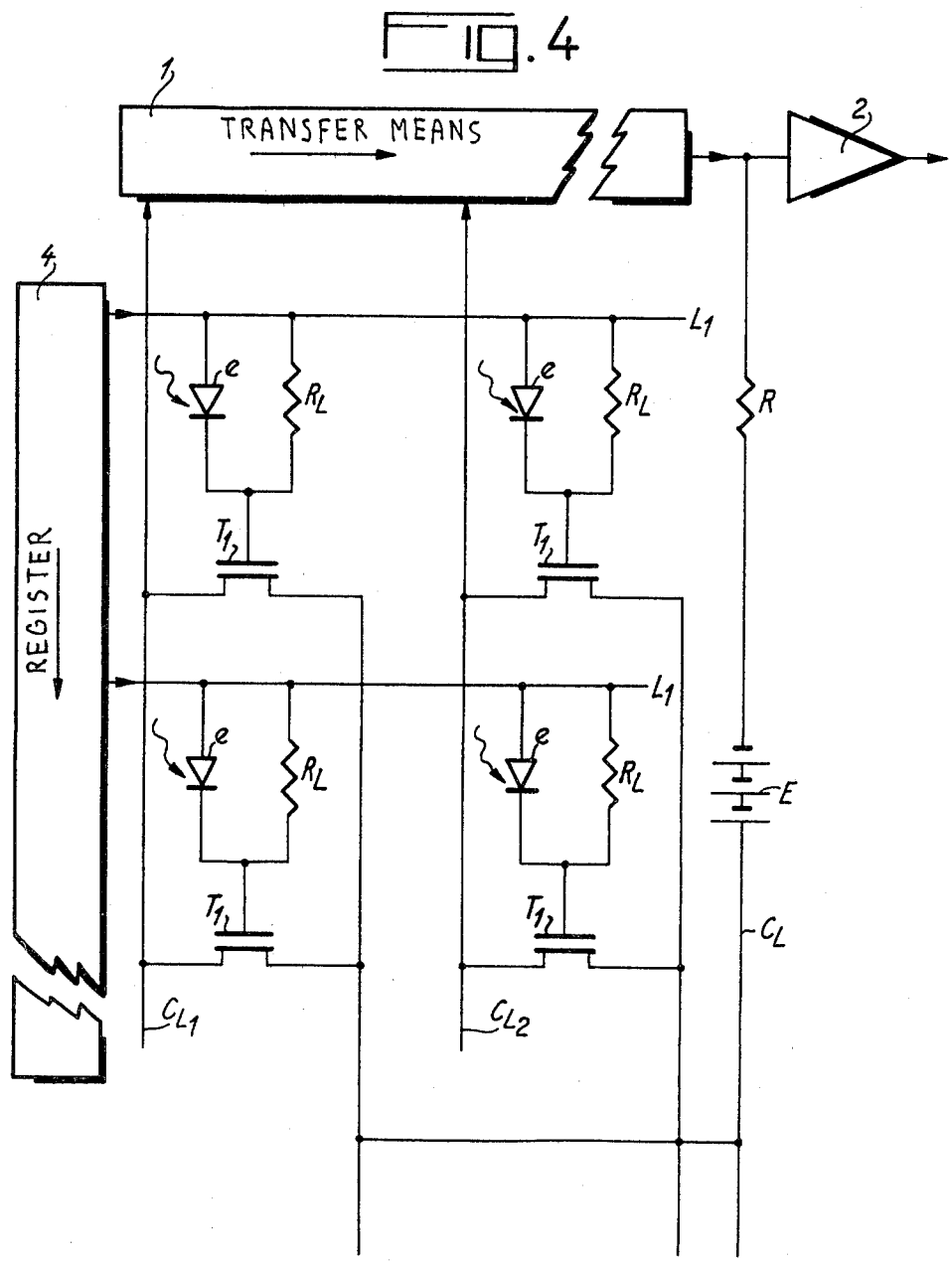

ELECTROMAGNETIC RADIATION DETECTION MATRIX

BACKGROUND OF THE INVENTION

The present invention relates to an electromagnetic radiation detection matrix.

In the prior art matrices are known for detecting electromagnetic radiation which are formed from junction field-effect transistors or JFET's. These transistors are periodically disabled by a pulse applied to their grid which is then left floating. The radiation received by each transistor reduces the thickness of the deserted layer under its grid, causes the opening of its channel and so enabling of the transistor. During application of a reading pulse to the drain or to the source of each transistor, there flows between the drain and the source a current whose magnitude is related to the radiation received by each transistor.

These matrices are generally formed on monocrystalline semiconductor materials, such as silicon for example.

A problem arises with detection matrices of the known art when it is a matter of constructing large detection surfaces, having a side of twenty to thirty centimeters. It is in fact not technically possible to obtain monocrystalline semiconductor surfaces of such a size.

The present invention resolves this problem.

SUMMARY OF THE INVENTION

The matrix for detecting electromagnetic radiation in accordance with the invention comprises photosensitive elements formed by thin-film technology on the same dielectric substrate and disposed at each crossing point of lines and perpendicular columns. Means for addressing each line of photosensitive elements are formed by an MOS transistor, constructed by thin-film technology and associated with each photosensitive element. Each addressing transistor receives periodically on its grid an enabling pulse applied simultaneously to all the addressing transistors in the same line of photosensitive elements and is connected to means for transferring to a video amplifier the electric signals supplied by each line of elements addressed. Finally, means for amplifying the electric signal provided by each photosensitive element are associated with each of these photosensitive elements and constructed in accordance with thin-film technology.

The photosensitive elements are preferably formed by photodiodes or photoconductors.

The matrix in accordance with the invention presents numerous advantages among which may be noted:

the possibility of obtaining detection matrices with large surfaces from twenty to thirty centimeters per side by using photosensitive elements, addressing means and amplifying means constructed to thin-film technology, obtained by evaporation on a dielectric substrate which is generally glass;

the capacity of the matrices of the invention to detect low-level radiation of the order of $10^{-1}$ Lux;

the capacity, in preferred embodiments, of resolving the problems arising from the fluctuations of the threshold voltage from one thin-film MOS transistor to the other;

its great simplicity of construction and its high efficiency particularly in embodiments where a single periodic signal is required for its operation;

the non-destructive reading and the possibility of easily adjusting the integration time of the image.

the obtained operating frequencies compatible with the TV standards.

DESCRIPTION OF THE DRAWINGS

Other objects, characteristics and results of the invention will appear from the following description, given by way of non-limiting example and illustrated by the accompanying figures which show:

FIGS. 2, 3, 4 three embodiments of a matrix in accordance with the invention.

In the different figures, the same reference numbers designate the same parts, but for the sake of clarity, the sizes and proportions of the different elements have not been respected.

DESCRIPTION OF THE PREFERRED EMBODIMENTS

Figure 1:
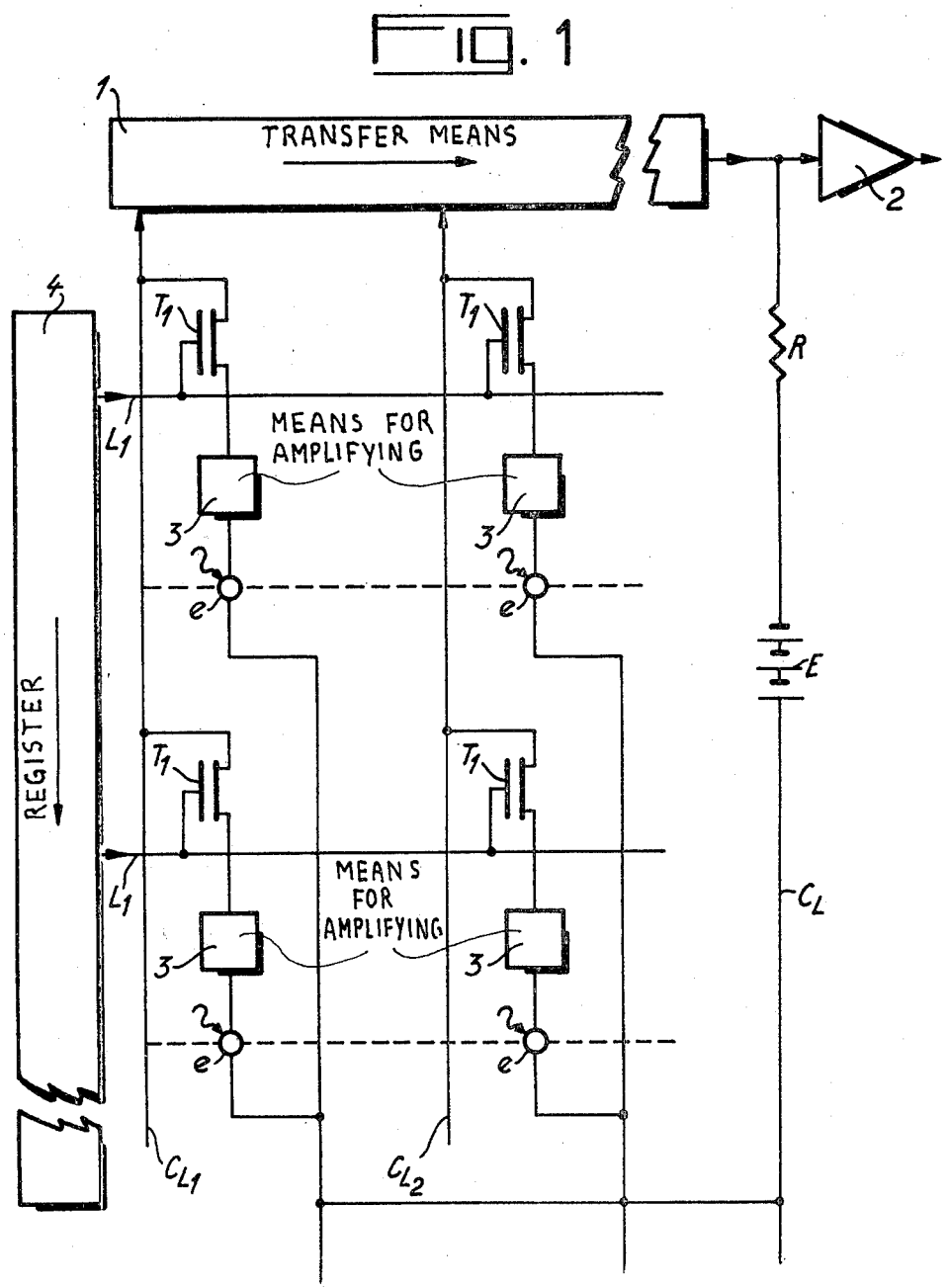
FIG. 1, a simplified diagram of a matrix in accordance with the invention.

FIG. 1 shows a simplified diagram of a matrix in accordance with the invention.

The matrix in accordance with the invention comprises a photosensitive element e at each point where lines and perpendicular columns cross each other. These photosensitive elements are made in accordance with thin-film technology by evaporation on the same dielectric substrate which is generally glass. These photosensitive elements e are either photodiodes, or photoconductors.

The material which forms them depends on the radiation to be detected. In the case of visible radiation, the detectors may be made from cadmium sulfide, CdS, in the case of X radiation, the detectors may be made from cadmium telluride, CdTe.

Means provide for addressing one line of photosensitive elements at one and the same time. These means are formed by MOS transistors made from cadmium selenide CdSe for example, made in accordance with thin-film technology, T1, which are associated with each photosensitive element e. Each addressing transistor T1 receives periodically on its grid an enabling pulse L1 which is applied simultaneously to all the addressing transistors in the same line. The enabling pulse L1 is obtained, in a known way, by a register 4 which conveys an enabling pulse or by a multiplexer.

The addressing transistors T1 relative to the same column of photosensitive elements e are connected by the same column $CL_1, CL_2, \ldots CL_N$ to transfer means 1 connected to a video amplifier 2. These transfer means are constituted by a device with N parallel inputs and a serial output.

Each line of photosensitive elements addressed, i.e. each line of photosensitive elements whose addressing transistors T1 have been enabled, then sends electric signals representative of the radiation received by each photosensitive element, in parallel, to the transfer means 1 connected to video amplifier 2.

The transfer means may be constructed by thin-film technology. They may also be formed from silicon components such as a shift register of the BBD or CCD type or a multiplexer. Because of the rather low cut-off frequency of the thin-film addressing transistors T1, the transfer means are preferably formed from two devices capable of stocking and restoring the electric signals. When one of these devices receives the electric signals coming from a line of photosensitive elements, the other device transfers the signals from the preceding line to the video amplifier. At the next line, the role of each device is reversed. It is even possible to use several pairs of devices for receiving and transferring signals if the cut-off frequency of the addressing transistors T1 requires it. Means 3 for amplifying the electric signal supplied by each photosensitive element e are associated with each photosensitive element and formed by thin-film technology. These means 3 are shown symbolically by a square in the figure. Amplification at the level of each photosensitive element has proved necessary because of the relatively high value of the capacity of the vertical lines called columns which bring the electric signals to the transfer means 1 with respect to the horizontal lines which convey the control pulses or signals, such as the enabling pulse L1, which are required for the operation of the matrix.

This capacity between lines and columns causes a reduction in the value of the electric signals transported which thus become very sensitive to parasites. Amplification at the level of each photosensitive element gets round these disadvantages.

In FIG. 1, only the addressing and amplifying means associated with four photosensitive elements have been shown.

There will be given hereafter the number of elementary modules to each photosensitive element with which are associated addressing and amplifying means and different elements such as a resistor or a capacitor.

The elementary modules are connected between one of the columns $CL_1, CL_2, \ldots CL_n$ and a common column CL connected to the common point between transfer means 1 and video amplifier 2: this column CL comprises a DC voltage source E in series with a resistor R.

FIGS. 2, 3, 4 show three embodiments of the matrix of the invention.

In the embodiment shown in FIG. 2, the photosensitive elements e are formed by photodiodes. The amplifying means are formed by an MOS transistor T2, made according to thin-film technology, which is connected between an addressing transistor T1 and the positive terminal of source E. The common terminal between transistors T1 and T2 is designated A. The grid of each amplifying transistor T2 is connected to a photodiode e which receives a control voltage L2 conveyed by a horizontal line to the photodiodes of the same line. The photodiode e receives the radiation to be detected which is symbolized by a wavy arrow in the figure.

In the example shown in FIG. 2, the amplifying transistor is enabled when a positive pulse is applied to its grid. Finally, the anode of diode e is connected to the grid of T2. It would of course be possible to obtain the same operation by using an amplifying transistor T2 which becomes conducting when it receives a negative pulse, a diode whose cathode is connected to the grid of T2 and a voltage L'2 whose sign is opposite that of voltage L2.

The control of L2 is in the case of FIG. 2 formed by means of a positive reference voltage Vm on which is periodically superimposed a pulse which gives to L2 a maximum negative value $V_I$.

Each negative voltage pulse forwardly biases the photodiode. The negative voltage $V_I$ is then directly applied to the grid of transistor T2 whose grid capacity $C_G$ is charged to $V_I$. From the beginning of reduction of the pulse, the voltage $V_I$ of the grid reversely biases the photodiode whose cathode is at the positive voltage Vm. The photodiode is in the detecting position. Any incident photon will discharge it. The expression of the voltage $V_G$ on the grid of T2 after each pulse of the negative voltage L2 is obtained, while taking into account the capacity $C_D$ of the reversely-biased photodiode and by writing first of all of the charge variation dQ which occurs at the terminals of capacities $C_D$ and $C_G$ in series when the control voltage L2 goes from $V_I$ to $V_m$:

$$dQ = \frac{C_D \cdot C_G}{C_D + C_G} \cdot (V_m - V_I)$$

This charge variation dQ causes a biassing potential difference $V_{PD}$ of the photodiode equal to:

$$V_{PD} = \frac{dQ}{C_D} = \frac{C_G}{C_D + C_G} \cdot (V_m - V_I)$$

The voltage $V_G$ on the grid of T2 is then written:

$$V_G = V_m - V_{PD} = V_m \cdot \frac{C_D}{C_D + C_G} + V_I \cdot \frac{C_G}{C_D + C_G}$$

It can then be seen that it is possible by acting on the values of $V_m$ and $V_I$ to reversely bias the diode and to make conducting the amplifying transistor T2 which is associated therewith.

The charges created in the photodiode by the radiation to be detected are to be found at the terminals of the grid $C_G$ and diode $C_D$ capacities which, with respect to these charges, are in parallel. The choice of the relative values of $C_D$ and $C_G$ must comply with the two following requirements:

the capacities $C_D$ and $C_G$ must not be too high so that the voltage obtained at the terminals of the capacity $(C_D + C_G)$ is not reduced too much;

the capacity $C_G$ must not be too small with respect to $C_D$ if the requirement is to be avoided of a high voltage difference $(V_m - V_I)$ in order to obtain a biassing voltage for the photodiode $V_{PD}$ of the order of 10 V which is necessary for proper operation of the photodiode.

The photodiode is then periodically reversely biased by L2. This reverse-bias mode of the photodiode presents the great advantage of not requiring any transistor connected to the cathode of the diode for reversely biassing it.

The leaks due to the reverse-biassing transistor in the disabled condition in the diode would in fact greatly disturb the operation of the matrix.

Between two negative pulses on L2 which forwardly bias the diode, the enabling pulse L1 (which makes T1 conducting) causes a current representative of the radiation received by each photodiode to flow in columns CL1, CL2, ... CLn towards the transfer means 1 and the video amplifier 2.

The disadvantage of the elementary module which has just been described is that the reading current $I_{DS}$ which flows in the transistors T2 of the same line when transistors T1 are enabled does not vary in a simple way depending on the voltage $V_{GS}$ between the grid and the source of each transistor T2, which conveys the information concerning the radiation received by each photodiode.

According as to whether the drain voltage of T2 is greater or less than its grid voltage, the current $I_{DS}$ in T2 is written:

$$-I_{DS} = K(W/L)(V_{GS} - V_{TH})^2,$$

this is the saturated mode of operation;

$$-I_{DS} = K \cdot (W/L)((V_{GS} - V_{TH}) \cdot V_{DS} - (V_{DS}/2)^2),$$

this is the triode mode of operation; where K, W, L, $V_{GS}$, $V_{TH}$ and $V_{DS}$ have the significance usual in MOS technology.

The current $I_{DS}$ does not vary in a simple way depending on the voltage $V_{GS}$, even if only the small current and voltage variations are considered in which case we obtain:

$$dI_{DS} = (\partial I_{DS}/\partial V_{GS}) \cdot dV_{GS}$$

To avoid the disadvantage due to the fact that the current $I_{DS}$ does not vary in a simple way depending on the voltage $V_{GS}$, a storage capacitor $C_S$ is mounted in parallel across each amplitude transistor T2.

Each transistor T2 is enabled as long as $(V_{GS} - V_{TH})$ is positive. Current passing through T2 reduces the voltage $V_{GS}$ and increases the potential $V_S$ at A by discharging the storage capacitor $C_S$ until $V_{GS}$ is equal to $V_{TH}$ and until we have therefore: $V_S = V_G - V_{TH}$. The potential $V_S$ at point A stabilizes itself then automatically at the value $(V_G - V_{TH})$. There is transfer of the signal $V_G$ conveyed by the grid of T2, which represents the information received by each photodiode, to the terminals of storage capacitor $C_S$. This storage capacitor $C_S$ has a value which is chosen to be about a hundred times greater than the sum of the capacity of the reversely-biassed diode $C_D$ and the grid capacitor $C_G$ of transistor T2. By transferring the signal $V_G$ to the terminals of $C_S$, advantage is taken of a charge gain also of the order to a hundred. The enabling pulse L1 which makes transistors T1 conducting causes, in columns CL1, CL2, ... CLn, a current to pass for recharging each capacitor $C_S$ to its initial value and which is then representative of the signal $V_S = V_G - V_{TH}$ established at point A.

The elementary module comprising a storage capacitor $C_S$ presents two disadvantages;

on the one hand, the reading current which flows in CL1, CL2, ... CLn depends on the signal $V_S = V_G - V_{TH}$ established at each point A, the terminal of a transistor T2. Now the threshold voltage $V_{TH}$ of the MOS transistors T2 varies greatly from one transistor T2 to another;

on the other hand, the current which flows through each transistor T2 as long as $V_S$ is not equal to $(V_G - T_{TH})$, becomes smaller and smaller as $V_S$ tends towards $(V_G - V_{TH})$. A time constant of the order of a second is then required for transferring to point A a fraction close to 1 (for example 99%) of the voltage $(V_G - V_{TH})$. It is therefore not possible to operate in real time.

These two disadvantages are overcome if each elementary module comprises in addition to storage capacitor $C_S$, a resistor $R_L$ connected between the point A of T2 and a reference potential L3 conveyed by a horizontal line.

The values of the resistor $R_L$ and of the reference potential L3 are chosen so that the point A of T2 is brought to a potential equal to that which it assumes in the absence of resistor $R_L$, when the grid of transistor T2 receives no signal. The signal which flows through CL1, CL2, ... CLn during reading depends then directly on the radiation received by each photodiode.

The DC control voltage L2 which reversely biases each photodiode e and which causes T2 to conduct causes a current to flow through T2 and $C_S$ which discharges $C_S$. The enabling pulse L1 of T1 causes a reading current to flow in CL1, CL2, ... CLn which depends directly on the radiation received by each photodiode e and which recharges $C_S$.

The addition of resistor $R_L$ causes:

on the one hand, suppression of the influence of the threshold voltage $V_{TH}$ of transistors T2 on the reading signal. In fact, in practice, the same potential L3 is applied to the resistors $R_L$ of the elementary modules of the same line of photosensitive elements and the value of the resistors $R_L$ is adjusted, by laser shaping for example, so that point A of each transistor T2 receives a potential equal to that of this point A in the absence of resistor $R_L$ and of signal on the grid of T2;

on the other hand, a time constant for transferring the voltage variation on the grid of T2 to point A practically instantaneous of the order of $10^{-4}$ seconds.

Resistor $R_L$ must be of the order to two to three times the value of the impedance of transistor T2 for the rest grid bias which is applied thereto so that a fraction close to 1 of the voltage variation on the grid of T2 is transmitted to point A.

Another embodiment of the elementary module may be considered in which there is no storage capacitor $C_S$ in parallel across T2 but in which the resistor $R_L$ is kept. In this case, there flows in CL1, CL2, ... CLn when transistors T1 are enabled by L1 a current which depends directly on the change of potential at point A and so on the signal received by the photodiode.

The control voltage L2 may be, like L1, supplied by register 4 which conveys an enabling pulse. The reference voltage L3 is generally formed by the positive terminal of the voltage source E.

Each elementary module comprises then three lines L1, L2, L3 which convey control pulses or signals.

To sum up, the first elementary module described may be formed solely by transistors T1 and T2 and the photodiode e, but it may also comprise a capacitor $C_S$ and a resistor $R_L$ or one or other of these elements.

The matrix in accordance with the invention presents the advantage of allowing non-destructive reading. The enabling of the transistors T1 of a line does not modify the information inscribed on the photodiodes.

It is possible, depending on the case, to increase the integration times of the photodiodes, i.e. the time interval between the resetting pulses of the photodiodes while continuing to take the signal from points A by enabling the transistors T1 at the normal television image frequency. That allows a good image to be obtained without too much noise. It is also possible to reduce the integration time so as to obtain a non-shifted image.

FIG. 3 shows a second embodiment of the matrix of the invention.

In this elementary module, the photosensitive elements e are formed by photoconductances. These photoconductances are chosen with a spectral sensitivity adapted to the radiation to be detected. Their detection gain is high and their time constant is the order of a millisecond.

Each photoconductance e is mounted in parallel across a storage capacitor $C_S$ between the point A, the drain of transistors T1, and the positive terminal of source E.

Finally, a resistor $R_L$ is connected between point A, and a reference potential L3, conveyed by a horizontal line to all the resistors $R_L$ associated with the photoconductances of the same line.

For a given potential L3, the value of resistor $R_L$ is adjusted from one photoconductance to another so that the same darkness current flows in the photoconductances when they do not receive any radiation.

When each photoconductance e is subjected to the radiation, the value of its resistance varies which also causes the amount of charges stored in capacitor $C_S$ to vary. In this elementary module, the amplification means are formed solely by the storage capacitor $C_S$ associated with each photoconductance.

Enabling of T1 by the control pulse L1 causes a reading current to flow in each column CL1, CL2, ... CLn whose value depends on the charge of $C_S$ and so on the radiation received by the photoconductance e.

This second elementary module may operate without a resistor $R_L$ between A and L3.

In this case the potential at A varies depending on the different threshold voltage of transistors T1 and on the different darkness currents of the photoconductances which disturbs the reading signal. Moreover, the balancing of the potential at A takes place very slowly.

FIG. 4 shows a third embodiment of the matrix of the invention, in which the photosensitive elements are formed by photodiodes e.

In this case, the addressing and the amplification means are merged and are formed by transistors T1. The grid of these transistors receives periodically an enabling pulse L1 through a photodiode e connected so that this pulse makes it conducting. In the example shown in FIG. 4, transistor T1 is enabled by a positive pulse and the cathode of the photodiode e is connected to the grid of T1. Each positive pulse L1 causes then the photodiode e to be forwardly biassed and transistor T1 to be enabled. Then L1 assumes a negative value which reversely biases photodiode e and disables T1. The radiation received by the reversely-biassed photodiode modifies the grid potential of transistor T1 and the time when T1 is enabled, this modification provides then an amplified representation of the radiation received by each photodiode.

It would of course be possible to have the same operation by using a transistor T1 enabled by a negative pulse, a photodiode whose anode is connected to the grid of T1 and an enabling pulse L'1 of the opposite sign.

There may be placed in parallel across each photodiode e a resistor $R_L$ whose value is adjusted, from one module to the other, so that the leakage current in this resistor in the absence of radiation on the photodiode brings the grid potential of the transistor T1 to the same value for all the elementary modules. Thus it is possible to cancel out the effect due to the dispersion of the threshold voltages of transistors T1.

The module shown in FIG. 4 allows, like the one shown in FIG. 1, non-destructive reading of the information stored in the photodiode.

It is possible to reduce the number of horizontal lines transporting the control voltages or pulses required for the operation of each elementary module which is very advantageous for the practical construction of the matrix.

Thus, in the case of the module shown in FIG. 2, it is sufficient to choose addressing T1 and amplifying T2 transistors which are enabled by pulses of different signs for it to be no longer necessary to have two lines L1 and L2 and so that a single line L'1 may convey the control voltages for transistors T1 and T2. Since these control voltages have different signs, they only trigger a single one of the transistors T1 or T2 at a time.

The reference potential L3 of FIGS. 2 and 3 is generally formed by the positive terminal of voltage source E. It is possible to avoid the material need for line L3 which connects the resistors $R_L$ to the positive terminal of E. For that it is sufficient to use as reference potential the voltage conveyed by one of the lines L1, L2 or L'1 of the following line of elementary modules, this in the case of FIG. 2. In the case of FIG. 3, the voltage conveyed by line L1 of the following line of modules may be used as reference potential.

Thus it is possible in the case of the matrices shown in FIGS. 2 and 3 to use only a single horizontal line conveying the control voltages or signals to all the elementary modules of the same line of photosensitive elements.

The detection matrix of the invention is used in radiological image intensifiers where it provides conversion of the incident X photons into an electric reading signal, or only the detection of visible radiation in the case where the incident X photons are converted into photons of lesser energy by means of a scintillator. This scintillator is then formed by a panel placed in contact with the detecting mosaic.

What is claimed is:

1. A matrix for detecting electromagnetic radiation, comprising a photosensitive element at each crossing point of perpendicular lines and columns and means for addressing each line of photosensitive elements, wherein
    said photosensitive elements are thin-fim on the same dielectric substrate;
    said addressing means comprise an MOS thin film transistor associated with each photosensitive element, and which receives periodically on a grid an enabling pulse applied simultaneously to all the addressing transistors in the same line of photosensitive elements;
    thin film means for amplifying the electric signal provided by each photosensitive element are associated with each photosensitive element;
    means for transferring to a video amplifier the electric signals provided by each line of elements addressed, these means being constituted by a device with N parallel inputs and a serial output; to this device being connected the addressing transistors.

2. The matrix as claimed in claim 1, wherein the photosensitive elements are photodiodes.

3. The matrix as claimed in claim 1, wherein the photosensitive elements are photoconductances.

4. The matrix as claimed in claim 2, wherein said amplifying means comprise a thin-film MOS transistor connected between each addressing transistor and a positive terminal of the supply voltage source of the matrix, the grid of each amplifying transistor being connected to a photodiode which includes means for receiving a control voltage, applied to the photodiodes of the same line, and a reference voltage on which is periodically superimposed a pulse which gives to the control voltage a sign opposite that of the reference voltage and whose appearance causes the photodiodes to be forwardly biased and whose disapearance causes the photodiodes to be reversely biased and the associated amplifying transistors to be enabled.

5. The matrix as claimed in claim 4, wherein the addressing and amplifying transistors are enabled by pulses of different signs and these pulses are conveyed on the same line for each line of elementary modules.

6. The matrix as claimed in claim 4, wherein a storage capacitor is mounted in parallel across each amplifying transistor.

7. The matrix as claimed in claim 6, wherein the value of the storage capacitor is about a hundred times greater than the sum of the capacity of the reversely-biassed photodiode and the capacity of the grid of the associated amplifying transistor.

8. The matrix as claimed in claim 4, wherein a resistor is connected between the common point between each addressing transistor and amplifying transistor and a reference potential, the values of the resistor and of the reference potential being such that the common point is brought to a potential equal to that which it assumes in the absence of a resistor and without a signal on the grid of the amplifying transistor.

9. The matrix as claimed in claim 3, wherein the amplifying means are comprising by a storage capacitor which is mounted in parallel across each photoconductance, each photoconductance being connected between an addressing transistor and the positive terminal of the supply voltage source of the matrix.

10. The matrix as claimed in claim 9, wherein a resistor is mounted between the point common to the photoconductance, the storage capacitor and the addressing transistor, and a reference potential, the values of the resistor and of the reference potential being such that the same darkness current flows in each photoconductance.

11. The matrix as claimed in one of claims 8 or 10, wherein the reference potential applied to each resistor of the same line of photosensitive elements is conveyed by one of the lines conveying the control voltages or pulses of the following line of photosensitive elements.

12. The matrix as claimed in claim 2, wherein the amplifying means are comprising each addressing transistor whose grid receives periodically the disabling pulse through a photodiode connected so that this pulse makes it conducting, the photodiode then receiving a voltage which reversely biases it and disables the addressing transistor, the enabling time of this transistor then depending on the incident flux received by the photodiode.

13. The matrix as claimed in claim 12, wherein a resistor is mounted in parallel across each photodiode, the value of this resistor being such that the potential of the grid of all the addressing transistors, in the absence of radiation on the photodiode, is the same.

14. The matrix as claimed in claim 2, wherein the means for transferring are constituted by a charge transfer shift register.

15. The matrix as claimed in claim 2, wherein the means for transferring are constituted by a multiplexer.

16. A matrix for detecting electromagnetic radiation comprising
(a) a dielectric substrate;
(b) intersecting perpendicular lines and columns on said substrate;
(c) thin-film photosensitive elements at the intersection of said lines and columns for providing an electric signal in accordance with received electromagnetic radiation;
(d) means for addressing each line of said photosensitive elements including a thin-film MOS transistor associated with each photosensitive element and means for periodically applying an enabling pulse simultaneously to all the transistors in the same line;
(e) means for transferring to a video amplifier electric signals from the photosensitive elements in each line when addressed by the addressing means, said transferring means including a device having a plurality of inputs in parallel and a serial output, and being interconnected with the addressing transistors;
(f) means for amplifying the electric signal provided by each photosensitive element, said means including a plurality of thin-film amplifiers with one being associated with each photosensitive element.

* * * * *